US007709774B2

United States Patent

Schulz et al.

(10) Patent No.: US 7,709,774 B2

(45) Date of Patent: May 4, 2010

(54) COLOR LIGHTING DEVICE

(75) Inventors: Volkmar Schulz, Stolberg (DE); Eduard Johannes Meijer, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 1 day.

(21) Appl. No.: 12/090,874

(22) PCT Filed: Oct. 9, 2006

(86) PCT No.: PCT/IB2006/053689

§ 371 (c)(1),
(2), (4) Date: Apr. 21, 2008

(87) PCT Pub. No.: WO2007/046026

PCT Pub. Date: Apr. 26, 2007

(65) Prior Publication Data

US 2008/0290250 A1 Nov. 27, 2008

(30) Foreign Application Priority Data

Oct. 19, 2005 (EP) ................................. 05109702

(51) Int. Cl.

| | |
|---|---|
| ***G01J 1/32*** | (2006.01) |
| ***H01L 31/14*** | (2006.01) |
| ***H01L 29/16*** | (2006.01) |
| ***F21V 9/00*** | (2006.01) |
| ***G05F 1/00*** | (2006.01) |

(52) U.S. Cl. ......................... 250/205; 250/552; 257/82; 362/231; 315/307

(58) Field of Classification Search ............. 250/208.1, 250/552, 553, 559.13, 214 R, 214.1, 214 A, 250/214 LA, 216, 226, 205, 214 LS; 257/82, 257/88, 89; 362/231, 510–511, 543–545, 362/276, 800; 315/149, 169.01, 291, 294, 315/312

See application file for complete search history.

(56) References Cited

U.S. PATENT DOCUMENTS

| | | | | |
|---|---|---|---|---|
| 4,636,079 | A * | 1/1987 | Rieder et al. | 356/619 |
| 5,389,781 | A * | 2/1995 | Beck et al. | 250/226 |
| 6,069,676 | A | 5/2000 | Yuyama | |
| 7,218,656 | B2 * | 5/2007 | Nishimura | 372/38.02 |

(Continued)

FOREIGN PATENT DOCUMENTS

EP 1077444 A2 2/2001

(Continued)

*Primary Examiner*—Kevin Pyo
*Assistant Examiner*—Don Williams
(74) *Attorney, Agent, or Firm*—Volentine & Whitt, PLLC

(57) ABSTRACT

The invention relates to a color lighting device comprising at least one light-emitting source (1*a*, 1*b*, 1*c*) fixed on a common substrate (3), each light-emitting source (1*a*, 1*b*, 1*c*) comprising at least one light-emitting diode (LED) (1*a*, 1*b*, 1*c*), each light-emitting source (1*a*, 1*b*, 1*c*) comprising one photosensor (2*a*, 2*b*, 2*c*) that detects the light output only of the associated light source (1*a*, 1*b*, 1*c*), and each light-emitting source (1*a*, 1*b*, 1*c*) being connected to an analog control circuit (4*a*, 4*b*, 4*c*) that controls the drive of each light-emitting source (1*a*, 1*b*, 1*c*) separately on the basis of a light output detected by the associated photosensor (2*a*, 2*b*, 2*c*), while each control circuit (4*a*, 4*b*, 4*c*) comprises a comparator (5*a*, 5*b*, 5*c*) connected to the associated photosensor (2*a*, 2*b*, 2*c*).

7 Claims, 1 Drawing Sheet

U.S. PATENT DOCUMENTS

Figure 1:
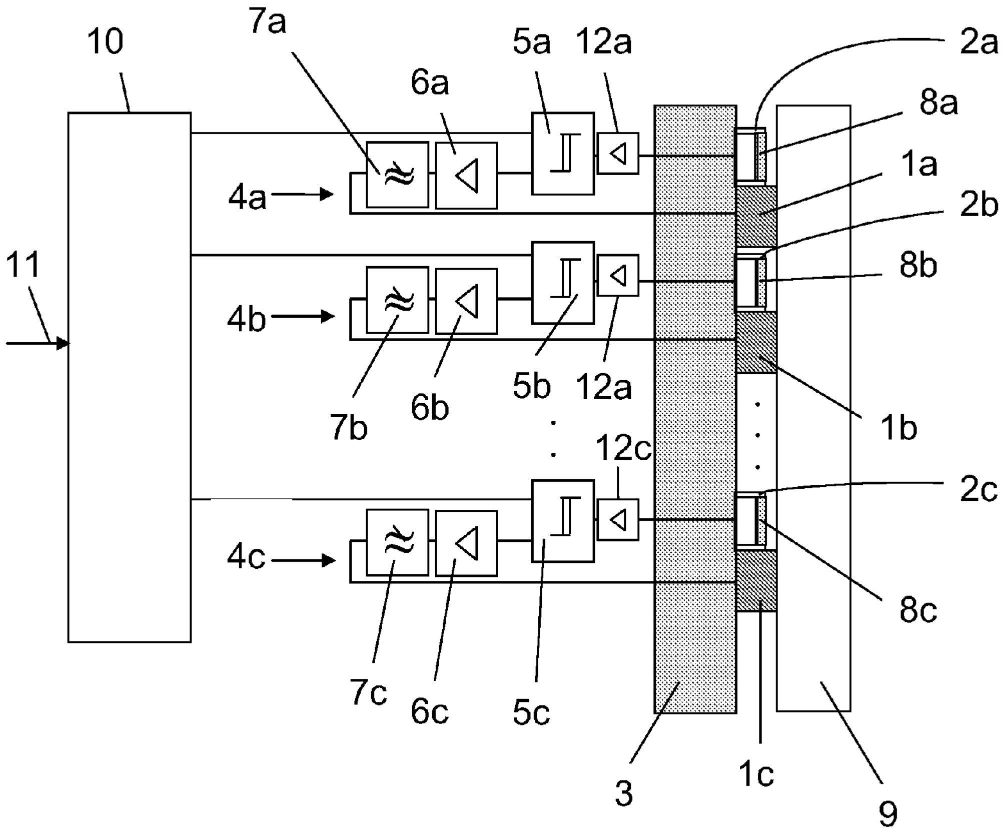

| | | | | |
|---|---|---|---|---|
| 2002/0130326 | A1 | 9/2002 | Tamura et al. | |
| 2003/0116695 | A1 * | 6/2003 | Masuda et al. | 250/205 |

FOREIGN PATENT DOCUMENTS

| | | | |
|---|---|---|---|
| EP | 1152642 | A2 | 11/2001 |
| GB | 1529473 | | 10/1978 |
| GB | 2204946 | A | 11/1988 |
| GB | 2409291 | A | 6/2005 |
| WO | WO9939372 | A2 | 8/1999 |
| WO | WO02080625 | A1 | 10/2002 |

* cited by examiner

COLOR LIGHTING DEVICE

The invention relates to a color lighting device comprising a plurality of light-emitting sources fixed on a common substrate, wherein each light-emitting source comprises at least one light-emitting diode (LED).

It is known that LEDs of different colors are used for constructing a lighting device that generates a wide range of colors. These LEDs define an area in the CIE xy-color-space which shows the color that can be realized by the weighted linear combination of these LEDs (e.g. red (R), green (G) and blue (B)). In future high-power LEDs, the dissipated power will lead to a temperature increase of the dies close to 200° C. At this temperature the emission spectrum of the LEDs shifts in an unacceptable way. One of the disadvantages is that the shift is noticed by the human eyes.

Red and green LEDs are known which are made of blue LEDs with a phosphor-ceramic layer on the top of the dies. Nevertheless, the intensity is still a function of the temperature, the current, and the lifetime. It is known that RGB-sensors can be used to control the color point. A considerable disadvantage of this approach is that these RGB-sensors are currently expensive and will suffer from their temperature dependency. Thus, one of the basic problems of known color lighting devices with color point control systems is that the sensor for color sensing has to fit the CIE color-matching functions. There are several commercial RGB-sensors available that claim to be close to the CIE color-matching functions, but none of these is sufficiently close to the CIE color-matching functions for the color control task. Furthermore, most of these RGB-sensors degrade at elevated temperatures. Another disadvantage of color lighting devices with color point control systems is that the spectral insensitivity has to be independent of the temperature, which is not the case for normal photodiodes. Anyhow, these sensors are specified for temperature ranges, e.g. up to 85° C., which is at some distance to the above-mentioned temperature.

Furthermore, it is known that color lighting devices comprise a control circuit with pulse width modulation (PWM), which controls the light output or the color of each single diode of the color lighting device. One of the disadvantages is that said color point control systems with pulse width modulation require very precise, complex and expensive components. Disadvantageously, PWM controlled multi-color lighting devices drive the LED in a very inefficient point if less than 100% of the maximum brightness is used (which is typically the case). In some cases it is possible that electromagnetic interaction with the environment occurs due to the high-frequency current components (required for accurate PWM).

US 2002/0130326 A1 describes a lighting device comprising a plurality of LEDs that are arranged in an at least two-dimensionally dispersed manner, a transparent resin layer that covers the plurality of LEDs in an integrated form, a photodetection unit using a photodetector that detects a light emission intensity from the plurality of LEDs, a power supply circuit unit that controls driving of the plurality of the LEDs based on a detection output from the photo-detection unit, wherein a number of the photodetectors is smaller than the number of LEDs, and the photodetector detects an intensity of light emitted from the LEDs and propagated through the transparent resin layer. The LEDs for different colors are turned on with mutually different timings. The photodetector can thus only detect the light intensity sequentially for each color.

The invention has for its object to eliminate the above disadvantages. In particular, it is an object of the invention to provide a lighting device with an inexpensive and simple setup with means for color point stabilization such that, even though each LED has different light-emission characteristics, a predetermined light-output state can be obtained.

This object is achieved by a color lighting device as taught by claim 1 of the present invention. The preferred embodiments of the invention are defined in the dependent claims.

Accordingly, a color lighting device is provided comprising at least one light-emitting source fixed on a common substrate, each light-emitting source comprising at least one light-emitting diode (LED), each light-emitting source comprising one photosensor that detects the light output only of the associated source, and each light-emitting source being connected to an analog control circuit that controls the drive of each light-emitting source separately on the basis of a light output detected by the associated photosensor, while each control circuit comprises a comparator connected to the associated photosensor. One of the essential advantages of this invention is that the control circuit controlling the color of the multi-color lighting device comprises a pure analog setup. Preferably, the color lighting device consists of light-emitting sources which emit blue light, the peak wavelength being in the range from 420 to 470 nm, red light with the peak wavelength being in the range from 590 to 630 nm, and green light with a peak wavelength being in the range from 510 to 550 nm. Alternatively, the light-emitting source emits invisible light, which may be ultraviolet light. The light source may comprise only a single diode producing light of a defined color. Alternatively, the light source may comprise a plurality of LEDs together producing light of a certain color which issues from the lighting device. Certainly, each LED may emit light with an individual peak wavelength. This means that each light source may comprise a bundle of LEDs, each LED emitting light of a different color. During the illumination process the color of the light output leaving the light source is a mixture of all single light contributions from the LEDs. According to a preferred embodiment of the present invention, the device consists of a plurality of n light sources that emit light, wherein each light-emitting source is separately driven by a single driver line. For example, the light-emitting source may consist of a mixture of small, e.g. GaN LEDs or broad-band emitters, e.g. phosphor-converted LEDs. During the illumination procedure the analog control circuit controls all light-emitting sources simultaneously in order to keep the optical output from the lighting device constant for a long time.

Each light-emitting source comprises an individual photosensor that detects the light output of said source. Every single photosensor is arranged in the color lighting device in such a manner that only the emitted light of the source is measured by the associated photosensor. Thus, high-quality information on the actual light output of each single light source can be obtained. According to the invention, the control circuit comprises an analog two-point control system. Each photosensor detects a photo signal containing the information on the actual light output of the associated light source. Preferably, this signal is amplified and translated into an input for an analog comparator, where it is compared with a reference signal. If the photosignal is less than the reference signal, the control circuit provides a high output-signal and if the photosignal is greater than the reference signal, the control circuit provides a low output-signal. If the two values of said signals are nearly equal, a low output-signal can also be provided. Preferably, the high output signal and the low output signal are fixed values stored in the color lighting device, which either increase or decrease the driving signal for the light-emitting source. The described two-point control has an easy setup and is even more efficient than a color control based on pulse width modulation. Moreover, the control procedure does not generate any flickering of the light output, because in the present invention the current through the light source is changed with very low speed for color adjustment purposes. The present invention is suitable for simultaneous use of e.g. phosphor-converted LEDs and narrow-band LEDs (GaN, AlGaAs, etc). Compared with the pulse width modulation used for light output control, the present multi-color lighting device requires a short current rise time.

In a preferred embodiment, the comparator is an analog Schmitt trigger. Preferably, the Schmitt trigger changes its output state when its input voltage level rises above a certain reference voltage. However, the output does not switch back automatically when the input voltage level sinks again unless a second, lower reference voltage threshold is crossed. This difference in threshold voltages results in a hysteresis. Advantageously, the hysteresis guards against noise that would otherwise cause a rapid switching back and forth between the two output states when the inputs are closed to the threshold voltage. Furthermore, the hysteresis is adjusted with respect to the low-pass filter that ensures that frequencies below 400 Hz are impossible.

In another preferred embodiment, the control circuit comprises a driver connected to the comparator, wherein the output of the driver is guided to a low-pass-filter connected to each light source. Depending on whether the output-signal of the comparator is high or low, the driving signal is changed in that a current flowing through the corresponding light source is changed, thereby preventing a change in the light output. The optical output from the device can thus be kept constant for a long time. According to a preferred embodiment of the invention, the driver is an amplifier or a switch. Preferably, the Schmitt trigger jumps between the high and the low output signal, the driver output signal being filtered by the low-pass filter that smoothes the driving signal to each light source.

Alternatively, the photosensor is arranged on the substrate next or adjacent to the light source. Also, it is possible that the photosensor is positioned between the light source and the substrate. In this case the light source is arranged on the photosensor. In another preferred embodiment, the substrate is arranged between the photosensor and the light source. That means that the photosensor is fixed at the opposite side of the substrate, where the light source is not positioned. A wave guide may be formed in the substrate between the light source and the photosensor in order to interconnect these two components. In a possible embodiment of the invention, the photosensor and/or the light source may be embedded in the substrate. Furthermore, the core of the substrate may be made of metal so as to diffuse and dissipate heat generated by each LED effectively. Alternatively, the substrate may be made of epoxy resin or may be a composite substrate made of epoxy resin mixed with alumina.

In a preferred embodiment of the present invention, the photosensor comprises a filter that is sensitive to the color of the associated light source. Said filter may be an optical filter. In order to prevent a wrong correction of the light output of the light source, the photosensor detects only the light output of the corresponding light source and is insensitive to other colors. Thus, overlapping areas are not generated. Preferably, each photosensor with a filter has a constant sensitivity over the wavelength range of interest for the applied colors. For narrow-band emitters, the filter response may be constant over a small wavelength regime. A filter response may have a very narrow band for phosphor-converted LEDs with a smooth response in the wavelength range of the peak sensitivity of the filtered-photosensor. Preferably, the filters allow light in the wavelength ranges corresponding to those emitted by the respective light sources to pass through, so that the photosensor that deals with the respective luminescent colors is provided with a specific sensitivity to a certain light source. According to the invention, the filters are constructed such that their spectral transmissivities are adjusted to light that conforms with the peak wavelengths of the corresponding colors of light of the respective associated light sources.

In a preferred embodiment of the color lighting device, the filter comprises at least one layer that is e.g. placed on the photosensor. The photosensor may be a silicon photodiode with dielectric layers on top in order to achieve the required spectral sensitivity of the filtered photodiode. In another preferred embodiment, the filter comprises a plurality of conductive layers. Alternatively, a constant response can be achieved by using a narrow-band filter with different responses on top of each photosensor, e.g. a Fabry-Perot filter.

The present invention also relates to a method of controlling the light output of a color lighting device with at least one light-emitting source fixed on a common substrate, each light-emitting source comprising at least one light-emitting diode, each light-emitting source comprising one photosensor that detects the light output only of the associated light-emitting source, and each light-emitting source being connected to an analog control circuit that controls the drive of each light-emitting source separately on the basis of a light output detected by the associated photosensor, while each control circuit comprises a comparator connected to the associated photosensor, said method comprising the following steps for color control: First, a photosignal is detected, which comprises the information on the actual light output of the single light source. After that, the photosignal is guided to the control circuit, where the comparator compares the photosignal with a reference signal, the control circuit providing a high output-signal that increases the driving signal for the light-emitting source if the photosignal is less than the reference signal. If the photosignal is greater than the reference signal, the control circuit provides a low output-signal that decreases the driving signal for the light-emitting source.

Preferably, the control circuit comprises a driver connected to the comparator, wherein the output of the driver is guided to a low-pass-filter connected to the light source, the value of the low output signal being zero. If the photosignal is greater than the reference signal, the value of the low output signal is zero. Consequently, the driver does not guide a signal, and as a result the driving signal for the light source decreases. Advantageously, the low-pass filter has a cut-off frequency of at least 10 kHz, making for a slow control circuit. The frequency determines the maximum rise time of the light source. If the user requires a higher rise time, the cut-off frequency can simply be increased. Preferably, the combination of low-pass filter and comparator does not allow frequencies below 400 Hz.

The described steps of the control procedure may be performed continuously and/or simultaneously for each light source. Certainly, said steps can be conducted periodically during operation of the lighting device. Advantageously, the measured photosignals are stored in a memory of a color controller which comprises a CPU for running an algorithm to calculate, for example, the brightness of each light source.

Preferably, the photosignal and the reference signal are voltage signals or current signals. For example the Schmitt trigger compares the output voltage signal of the photosensor with the reference voltage signal. If the photovoltage signal is less than the reference voltage signal, the output voltage of the Schmitt trigger is switched to a high output voltage signal. If the photovoltage signal is greater than the reference voltage signal, the output voltage signal of the Schmitt trigger is switched to a low output voltage.

The color lighting device as well as the method mentioned above can be used in a variety of systems, among them automotive systems, home lighting systems, backlighting systems for displays, ambient lighting systems, flashes for cameras (with adjustable color), or shop lighting systems.

The aforementioned components, as well as the claimed components and the components to be used in accordance with the invention in the described embodiments, are not subject to any special exceptions with respect to the size, shape, material selection, and technical concept, such that the selection criteria known in the pertinent field can be applied without limitations.

Additional details, characteristics, and advantages of the invention are disclosed in the dependent claims and the following description of the respective FIGURE, which is given by way of example only and shows a preferred embodiment of the lighting device according to the invention.

FIG. 1 is a highly schematic view of a color lighting device according to one embodiment of the present invention. The color lighting device comprises a plurality of light-emitting sources 1*a*, 1*b*, 1*c* having a certain distance to each other. In the embodiment shown, each light source 1*a*, 1*b*, 1*c* consists of a single LED 1*a*, 1*b*, 1*c*, i.e. the LED 1*a*, 1*b*, 1*c* is the light source 1*a*, 1*b*, 1*c* itself.

Alternatively, each light source 1*a*, 1*b*, 1*c* may comprise a bundle of LEDs, which is not illustrated explicitly. Each LED 1*a*, 1*b*, 1*c* is mounted on a substrate 3 that constitutes a heat sink. Each LED 1*a*, 1*b*, 1*c* comprises an adjacent photosensor 2*a*, 2*b*, 2*c* which is also fixed on said substrate 3. Each light-emitting diode 1*a*, 1*b*, 1*c* is connected to a single analog control circuit 4*a*, 4*b*, 4*c* comprising a comparator 5*a*, 5*b*, 5*c*, a driver 6*a*, 6*b*, 6*c*, and a low-pass filter 7*a*, 7*b*, 7*c*. In the embodiment shown, the comparator 5*a*, 5*b*, 5*c* is an analog Schmitt trigger connected to the associated photosensor 2*a*, 2*b*, 2*c* via a related amplifier 12*a*, 12*b*, 12*c*. The reference signals are connected to a color controller interface 10 which translates the user input 11 into the reference signals. The control circuits 4*a*, 4*b*, 4*c* are connected in parallel for controlling the drive of each light-emitting diode 1*a*, 1*b*, 1*c* separately on the basis of a light output detected by the associated photosensor 2*a*, 2*b*, 2*c*. Each photosensor 2*a*, 2*b*, 2*c* comprises a matched filter 8*a*, 8*b*, 8*c*. In the embodiment shown, the LED 1*a* emits red light, the LED 1*b* emits green light, and the LED 1*c* emits blue light. Certainly, the color lighting device may contain more than the colors mentioned here, which are separately controlled via the analog control circuit 4*a*, 4*b*, 4*c*. All circuits 4*a*, 4*b*, 4*c* are electrically identical, and therefore the red circuit line 4*a* only will be described in the following.

During the illumination process of the color lighting device, the photosensor 2*a* detects the light output of the associated red light source 1*a*. In order to get the correct information about the light output of the diode 1*a*, the photosensor 2*a* comprises said filter 8*a*, which transmits only the wavelength of the emitted light of the LED 1*a*. This means that the filtered photosensor 2*a* is insensitive to other colors. The measured photosignal is a voltage signal of the photosensor 2*a*, which is guided via amplifier 12*a* to the comparator 5*a*. In the embodiment described, the comparator 5*a* is a Schmitt trigger 5*a* which compares the voltage signal of the photosensor 2*a* with a reference voltage signal. If the photovoltage signal is less than the reference voltage signal, the control circuit 4*a* provides a high output signal which increases the driving signal of the light-emitting diode 1*a*. If the photovoltage signal is substantially equal to or greater than the reference voltage signal, the control circuit 4*a* provides a low output-signal which decreases the driving signal for the light-emitting diode 1*a*. The output of the Schmitt trigger 5*a* thus jumps between two voltage values.

The output of the Schmitt trigger 5*a* is connected to an amplifier 6*a*. The output of the amplifier 6*a* is applied to the low-pass filter 7*a* that is directly connected to the LED 1*a*. In the embodiment shown, the low-pass filter 7*a* has a cut-off frequency of 10 kHz. The described lighting device with the arranged control circuit 4*a*, 4*b*, 4*c* for each LED 1*a*, 1*b*, 1*c* allows an independent and parallel light output sensing of each color of said lighting device. The use of an analog circuit 4*a*, 4*b*, 4*c* for each LED 1*a*, 1*b*, 1*c*, wherein the photosignal of the photosensor 2*a*, 2*b*, 2*c* is used as a feedback-signal, provides an inexpensive and easy setup. Complex components like analog digital converters and digital signal processors with software are not necessary for the described analog color point stabilization of the multi-lighting device.

According to the embodiment, the high output voltage signal is approximately 5 V. This causes an increase in the driving current for the light-emitting diode 1*a*. If the photovoltage signal is greater than the reference voltage signal, the control circuit 4*a* provides a low, i.e. zero output voltage signal, which decreases the driving current for the light-emitting diode 1*a*. That means that the amplifier does not pass a current to the low-pass-filter 7*a*.

The LEDs 1*a*, 1*b*, 1*c* and the photosensors 2*a*, 2*b*, 2*c* are covered by an optical element 9 which is made of a transparent material.

LIST OF REFERENCE NUMERALS

1*a* light source, light-emitting diode, LED
1*b* light source, light-emitting diode, LED
1*c* light source, light-emitting diode, LED
2*a* photosensor
2*b* photosensor
2*c* photosensor
3 substrate
4*a* analog control circuit
4*b* analog control circuit
4*c* analog control circuit
5*a* comparator, Schmitt trigger
5*b* comparator, Schmitt trigger
5*c* comparator, Schmitt trigger
6*a* driver, amplifier
6*b* driver, amplifier
6*c* driver, amplifier
7*a* low-pass filter
7*b* low-pass filter
7*c* low-pass filter
8*a* optical filter
8*b* optical filter
8*c* optical filter
9 optic
10 color management unit
11 user input
12*a* amplifier
12*b* amplifier
12*c* amplifier

The invention claimed is:

1. A method of controlling the light output of a color lighting device with light-emitting sources fixed on a common substrate, each light-emitting source comprising at least one light-emitting diode, each light-emitting source comprising one photosensor that detects the light output only of the associated light source, and each light-emitting source being connected to an analog control circuit that controls the drive of each light-emitting source separately on the basis of a light output detected by the associated photosensor, each control circuit comprising a comparator (5*a*, 5*b*, 5*c*) connected to the associated photosensor, wherein the method comprises:

detecting a photosignal that contains information on the actual light output of the single light source, guiding the photosignal to the control circuit, in which the comparator compares the photosignal with a reference signal, whereupon if the photosignal is less than the reference signal the control circuit provides a high output signal that increases the driving signal for the light-emitting source, or if the photosignal is greater than the reference signal the control circuit provides a low output signal that decreases the driving signal for the light-emitting sources.

2. The method as claimed in claim 1, wherein the control circuit comprises a driver connected to the comparator, the output of the driver being guided to a low-pass filter which is connected to the light source, and the value of the low output signal being zero.

3. The method as claimed in claim 1, wherein the combination of low-pass-filter and comparator does not allow frequencies below 400 Hz.

4. The method according to claim 1, wherein the steps of claim 1 are performed continuously.

5. The method according to claim 1, wherein the photosignal and the reference signal are voltage signals or current signals.

6. The method according to claim 1, wherein the steps of claim 1 are performed simultaneously for all light-emitting sources.

7. The method as in claim 1 in combination with a color lighting device, the color lighting device comprising:

at least one light-emitting source fixed on a common substrate, each light-emitting source comprising at least one light-emitting diode (LED), each light-emitting source comprising one photosensor that detects the light output of the associated source only, and each light-emitting source being connected to an analog control circuit that controls the drive of each light source separately on the basis of a light output detected by the associated photosensor, each control circuit comprising a comparator connected to the associated photosensor.

* * * * *